United States Patent
Dixit et al.

(10) Patent No.: US 11,538,856 B2
(45) Date of Patent: Dec. 27, 2022

(54) MRAM DEVICE AND METHODS OF MAKING SUCH AN MRAM DEVICE

(71) Applicant: GLOBALFOUNDRIES U.S. Inc., Santa Clara, CA (US)

(72) Inventors: Hemant Dixit, Halfmoon, NY (US); Vinayak Bharat Naik, Singapore (SG)

(73) Assignee: GlobalFoundries U.S. Inc., Santa Clara, CA (US)

( * ) Notice: Subject to any disclaimer, the term of this patent is extended or adjusted under 35 U.S.C. 154(b) by 245 days.

(21) Appl. No.: 15/930,577

(22) Filed: May 13, 2020

(65) Prior Publication Data
US 2021/0359000 A1    Nov. 18, 2021

(51) Int. Cl.
| H01L 21/02 | (2006.01) |
| H01L 27/22 | (2006.01) |
| G11C 11/16 | (2006.01) |
| H01L 43/10 | (2006.01) |
| H01F 41/34 | (2006.01) |
| H01L 43/02 | (2006.01) |
| H01L 43/12 | (2006.01) |
| H01F 10/32 | (2006.01) |

(52) U.S. Cl.
CPC .......... *H01L 27/222* (2013.01); *G11C 11/161* (2013.01); *H01F 10/3259* (2013.01); *H01F 41/34* (2013.01); *H01L 43/02* (2013.01); *H01L 43/10* (2013.01); *H01L 43/12* (2013.01)

(58) Field of Classification Search
CPC ....... H01L 27/222; H01L 43/02; H01L 43/10; H01L 43/12
See application file for complete search history.

(56) References Cited

U.S. PATENT DOCUMENTS

| 7,476,954 B2 | 1/2009 | Wang et al. |
| 7,606,010 B2 | 10/2009 | Parkin |
| 10,103,317 B2 | 10/2018 | Hu |
| 10,168,143 B2 | 1/2019 | Annunziata et al. |
| 10,388,857 B2 | 8/2019 | Annunziata et al. |
| 10,453,509 B2 | 10/2019 | Hu et al. |
| 2019/0189908 A1 | 6/2019 | Ebrahimi et al. |

(Continued)

FOREIGN PATENT DOCUMENTS

| EP | 3264481 A1 * | 1/2018 | ............. B24B 37/20 |
| WO | WO-2016209272 A1 * | 12/2016 | ........... G11C 11/161 |

OTHER PUBLICATIONS

Chen et al., "Enhanced spin-torque in double tunnel junctions using a nonmagnetic-metal spacer," Appl Phys Lett., 107-152401, 2015.

(Continued)

*Primary Examiner* — Samuel A Gebremariam
(74) *Attorney, Agent, or Firm* — Yee Tze Lim; Hoffman Warnick LLC

(57) ABSTRACT

One illustrative MRAM cell disclosed herein includes a bottom electrode, a top electrode positioned above the bottom electrode and an MTJ (Magnetic Tunnel Junction) element positioned above the bottom electrode and below the top electrode. In this example, the MTJ element includes a bottom insulation layer positioned above the bottom electrode, a top insulation layer positioned above the bottom electrode; and a first ferromagnetic material layer positioned between the bottom insulation layer and the top insulation layer.

18 Claims, 4 Drawing Sheets

(56) References Cited

U.S. PATENT DOCUMENTS

2019/0339616 A1    11/2019  Yang et al.
2020/0106001 A1*    4/2020  Gupta ................... H01L 43/12

OTHER PUBLICATIONS

Chen et al., "Ultrahigh tunnel magnetoresistance using an artificial superlattice barrier with copper and aluminum oxide," EPL, 111-47005, Aug. 2015.

* cited by examiner

MRAM DEVICE AND METHODS OF MAKING SUCH AN MRAM DEVICE

BACKGROUND OF THE INVENTION

Field of the Invention

The present disclosure generally relates to the fabrication of integrated circuits, and, more particularly, to various novel embodiments of an MRAM (Magnetic Random Access Memory) cell and various novel methods of makings such MRAM cells on an integrated circuit (IC) product.

Description of the Related Art

A typical STT-MRAM (spin transfer torque magnetic random access memory) device comprises an MTJ (magnetic tunnel junction) structure positioned between a bottom electrode and a top electrode. The MTJ structure typically comprises a tunnel barrier layer (e.g., MgO) positioned between a pinned (or reference) ferromagnetic material layer and a free ferromagnetic material layer. Typically, the bottom electrode contacts the pinned layer and the top electrode contacts the free layer Typically, in an array of such STT-MRAM devices, the bottom electrode of each STT-MRAM device is coupled to a word line and the top electrode is coupled to a bit line.

The logic state stored in the device depends on the relative orientation between the magnetization direction of the free layer and the magnetization direction of the pinned layer. The relative orientation between the magnetization directions of the free layer and the pinned layer may have either a parallel orientation (designated by the letter "P") or an antiparallel orientation (designated by the letters "AP"). In the parallel orientation (P), the magnetization direction orientation of both the free layer and the magnetization direction orientation of the pinned layer are substantially the same. In the antiparallel orientation (AP), the magnetization direction orientation of the free layer and the magnetization direction orientation of the pinned layer are opposite of one another. When the MTJ structure is in the parallel orientation state, the MTJ structure is in a relatively low resistance state. Conversely, when the MTJ structure is in the antiparallel state, the MTJ structure is in a relatively high resistance state. In one illustrative embodiment, the parallel orientation of the MTJ structure may represent a logical "0" while the antiparallel orientation of the MTJ structure may represent a logical "1." The critical current ($I_C$) of the MTJ structure is the current that can cause the free layer to switch from one magnetization direction orientation to another magnetization direction orientation. Known "read" sensing circuitry is included on the IC product for sensing whether a logical "0" or a logical "1" is stored on a particular MRAM device. In operation, the current flow from the pinned layer to the free layer has to "tunnel through" the tunnel barrier layer.

Tunneling magnetoresistance is a quantum mechanical effect which occurs when two layers of ferromagnetic material are separated by a few atomic layers of an insulating material. The conductance of such a tunneling junction can vary dramatically depending on whether the ferromagnets are aligned in parallel or antiparallel. The effect is termed "tunneling magnetoresistance," and the ratio of resistances $(R_{AP}-R_P)/Rp$ is referred to as the tunneling magnetoresistance ratio (TMR). TMR is an important characteristic of STT-MRAM devices. Typical TMR ratios for at least some prior art STT-MRAM devices may fall in the range of about 150-180%, e.g., prior art STT-MRAM devices where the films of the device are made using a PVD process. However, with TMR values of this relatively low magnitude, the sense margin for sensing the state of the information stored on the STT-MRAM device is still relatively small. Improvements in the sense margin for STT-MRAM devices is desirable.

Accordingly, improvements in MRAM devices and methods of making such MRAM devices are desired within the industry.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel embodiments of an MRAM cell and various novel methods of makings such MRAM cells on an IC product. One illustrative MRAM cell disclosed herein includes a bottom electrode, a top electrode positioned above the bottom electrode and an MTJ (Magnetic Tunnel Junction) element positioned above the bottom electrode and below the top electrode. In this example, the MTJ element includes a bottom insulation layer positioned above the bottom electrode, a top insulation layer positioned above the bottom electrode; and a first ferromagnetic material layer positioned between the bottom insulation layer and the top insulation layer.

BRIEF DESCRIPTION OF THE DRAWINGS

The disclosure may be understood by reference to the following description taken in conjunction with the accompanying drawings, in which like reference numerals identify like elements, and in which.

Figure 1:
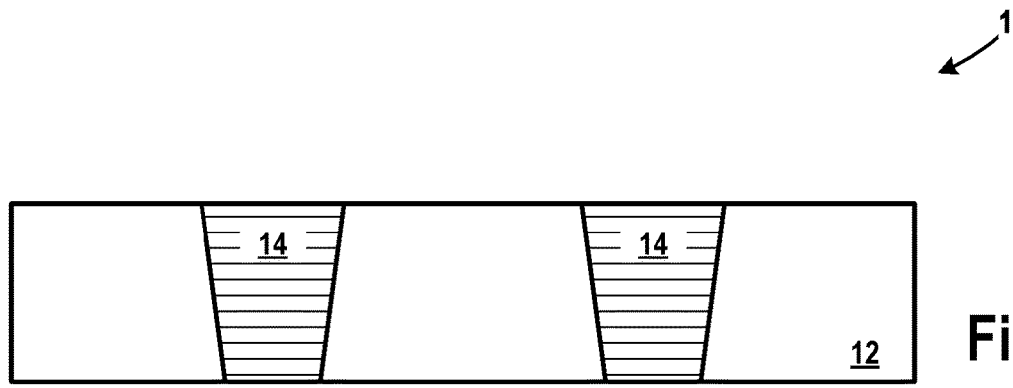
FIGS. 1-7 depict various novel embodiments of an MRAM cell and various novel methods of makings such MRAM cells on an IC product. The drawings are not to scale.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As will be readily apparent to those skilled in the art upon a complete reading of the present application, the various embodiments of the MRAM device disclosed herein may be incorporated into any type of integrated circuit product, e.g., it may be a stand-alone memory product, a product when memory circuits are embedded with logic circuits, etc. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, etc. The thicknesses of these various layers of material may also vary depending upon the particular application. With reference to the attached figures, various illustrative embodiments of the methods and devices disclosed herein will now be described in more detail.

FIGS. 1-7 depict various novel embodiments of an MRAM (Magnetic Random Access Memory) cell and various novel methods of making such MRAM cells on an IC product 10. As will also be appreciated by those skilled in the art after a complete reading of the present application, the inventions disclosed herein may be employed on any form or type of MRAM device, e.g., spin-orbit torque (SOT) MRAM, voltage-controlled magnetic anisotropy (VCMA) MRAM, etc. Thus, the presently disclosed inventions should not be considered to be limited to any particular type or form of MRAM device.

The IC product 10 will be formed on and above a semiconductor substrate (not shown). The semiconductor substrate may have a variety of configurations, such as a bulk silicon configuration. The substrate may also have a semiconductor-on-insulator (SOI) configuration that includes a base semiconductor layer, a buried insulation layer and an active semiconductor layer positioned above the buried insulation layer, wherein transistor devices (not shown) that are formed on the substrate are formed in and above the active semiconductor layer. The substrate may be made of silicon or it may be made of materials other than silicon. Thus, the terms "substrate" or "semiconductor substrate" should be understood to cover all semiconducting materials and all forms of such materials.

Prior to performing the processing operations shown in FIG. 1, various transistor devices (not shown in FIG. 1), as well as various conductive contact structures (not shown in FIG. 1) that are coupled to those transistor devices, were formed in and above the semiconductor substrate. For example, at this point in the process flow, a transistor (not shown) that functions as a read switching element for the MRAM cell, as well as perhaps other CMOS-based transistors (not shown) for other non-memory circuits (such as peripheral logic circuits), would have been formed for the product 10 using traditional manufacturing techniques. FIG. 1 depicts the product 10 after a layer of insulating material 12 (e.g., silicon dioxide, a low-k (k value less than 3.3)) was formed at some location above the substrate. Also depicted in FIG. 1 is a plurality of conductive structures 14, (e.g., conductive vias) that were formed in the layer of insulating material 12. The conductive structures 14 may be comprised of any conductive material, they may be of any desired configuration, and they may be manufactured using any of a variety of different known manufacturing techniques (e.g., single or dual damascene). As will be appreciated by those skilled in the art after a complete reading of the present application, each of the conductive structures 14 will be conductively coupled to a bottom electrode of a novel MRAM cell disclosed herein.

Figure 2:
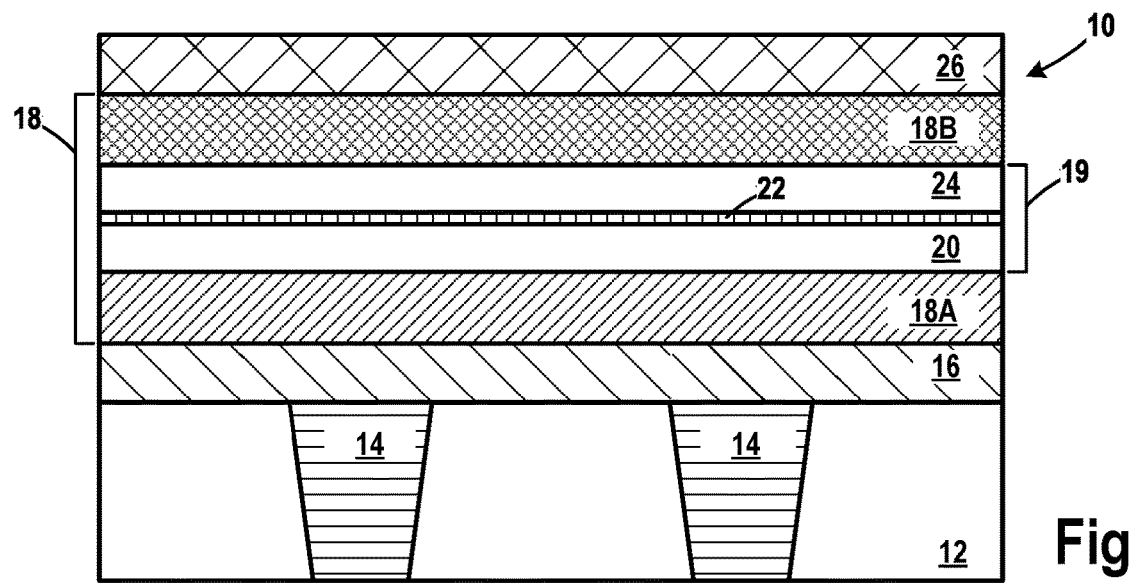

FIG. 2 depicts the IC product 10 after various layers of material are sequentially blanket deposited above the layer of insulating material 12. More specifically, a layer of bottom electrode material 16, a plurality of layers of material for an MTJ (Magnetic Tunnel Junction) element 18, and a layer of top electrode material 26 were sequentially deposited above the layer of insulating material 12. The layer of bottom electrode material 16 may be formed to any desired thickness and it may be formed of any conductive material, e.g., a metal-containing material, a metal compound, etc. In one illustrative embodiment, the layer of bottom electrode material 16 may be comprised of tantalum nitride. The layer of top electrode material 26 may be formed to any desired thickness and it may be formed of any conductive material, e.g., a metal-containing material, a metal compound, etc. In one illustrative embodiment, the layer of top electrode material 26 may be comprised of tantalum nitride. The bottom and top layers of electrode material 16, 26 need not be formed of the same conductive material (nor the same thickness), but that situation may occur in some applications.

The MTJ element 18 depicted herein is intended to be representative of any type of MTJ element 18 formed for MRAM cells. The MTJ element 18 depicted herein may be comprised of a variety of different materials, with a variety of different thicknesses, that are arranged in a variety of different configurations. In one illustrative embodiment, the MTJ element 18 may be comprised of a pinned (or reference) ferromagnetic material layer 18A, a free ferromagnetic material layer 18B and a composite insulator-ferromagnetic material-insulator (IFI) structure 19.

The pinned ferromagnetic material layer 18A may be formed to any desired thickness, e.g., 1-5 nm, and it may be comprised of any of a plurality of ferromagnetic materials, e.g., a Co/Pt or Co/Ni multi-layer, Co, Fe, Ni, a CoFeB alloy, etc. Although the pinned ferromagnetic material layer 18A is simplistically depicted as a single layer of material in the attached drawings, in a real-world device, the pinned ferromagnetic material layer 18A may comprise multiple layers of material arranged in a variety of different stack configurations (from top to bottom).

The free ferromagnetic material layer 18B may be formed to any desired thickness, e.g., 1-3 nm, and it may be comprised of any of a plurality of ferromagnetic materials, e.g., a Co/Pt or Co/Ni multi-layer, Co, Fe, Ni, a CoFeB alloy, etc. Although the free ferromagnetic material layer 18B is simplistically depicted as a single layer of material in the attached drawings, in a real-world device, the free ferromagnetic material layer 18B may comprise multiple layers of material arranged in a variety of different stack configurations (from top to bottom). The pinned ferromagnetic material layer 18A and free ferromagnetic material layer 18B need not be formed of the same ferromagnetic material(s) (nor formed with the same thickness), but that situation may occur in some applications.

With continued reference to FIG. 2, the IFI structure 19 comprises a bottom insulation layer 20, a ferromagnetic material layer 22 positioned above the bottom insulation layer 20 and a top insulation layer 24 positioned above the ferromagnetic material layer 22. In one illustrative embodiment, the bottom insulation layer 20 is positioned on and in physical contact with the layer of bottom electrode material 16, the ferromagnetic material layer 22 is positioned on and in physical contact with the bottom insulation layer 20 and the top insulation layer 24 is positioned on and in physical contact with the ferromagnetic material layer 22.

The top insulation layer 24 may be formed to any desired thickness, e.g., 0.5-1.5 nm, and it may be formed of any insulating material. In one illustrative embodiment, the top insulation layer 24 may comprise an oxide-based insulating material, e.g., MgO, $Al_2O_3$, $TiO_x$, AlTiO, MgZnO, ZnO, $Ga_2O_3$, etc. The bottom insulation layer 20 and the top insulation layer 24 need not be formed of the same material (or stack of materials), nor formed with the same thickness, but that situation may occur in some applications.

The ferromagnetic material layer 22 of the IFI structure 19 may be formed of any ferromagnetic material(s), e.g., a Fe, Co, FeB, Co/Pt or Co/Ni multi-layer, a CoFeB alloy, etc. As will be described more fully below, in one illustrative embodiment, it is very important that the ferromagnetic material layer 22 be very thin. In one illustrative embodiment, the ferromagnetic material layer 22 is formed to a thickness of less than 10 angstroms. In one illustrative example, the ferromagnetic material layer 22 may be formed by performing a PVD process or a CVD process.

Figure 3:
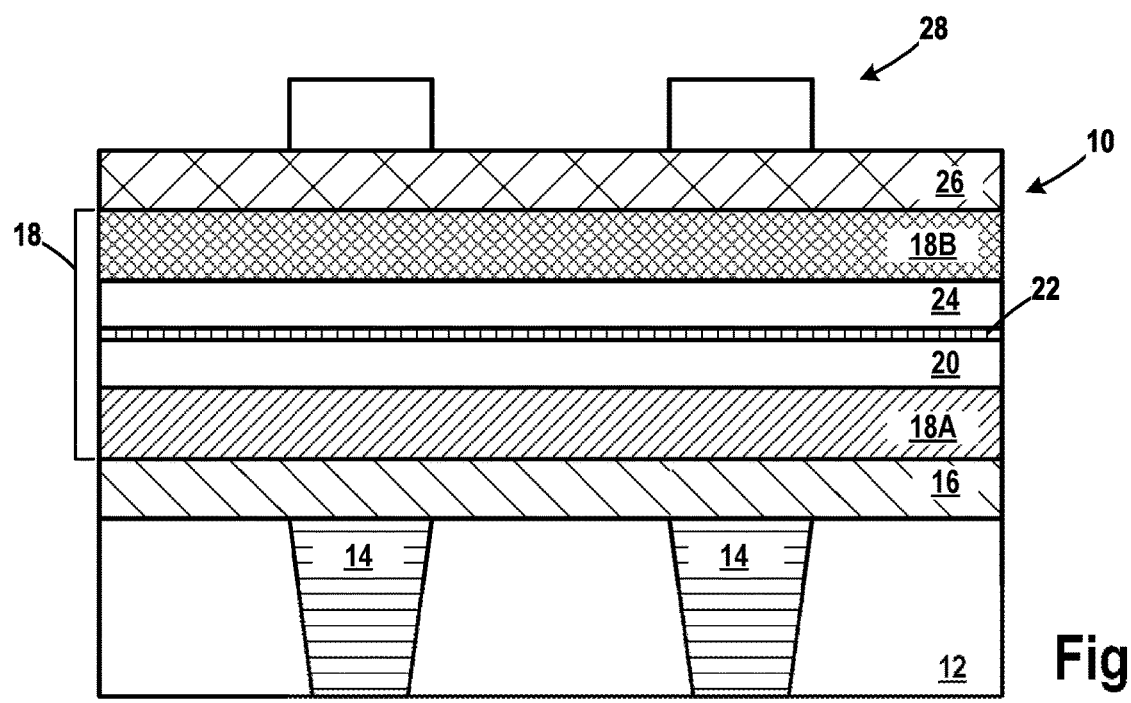

FIG. 3 depicts the IC product after, e.g., a patterned layer of photoresist/BARC 28, was formed on the product 10 by performing traditional manufacturing techniques.

Figure 4:
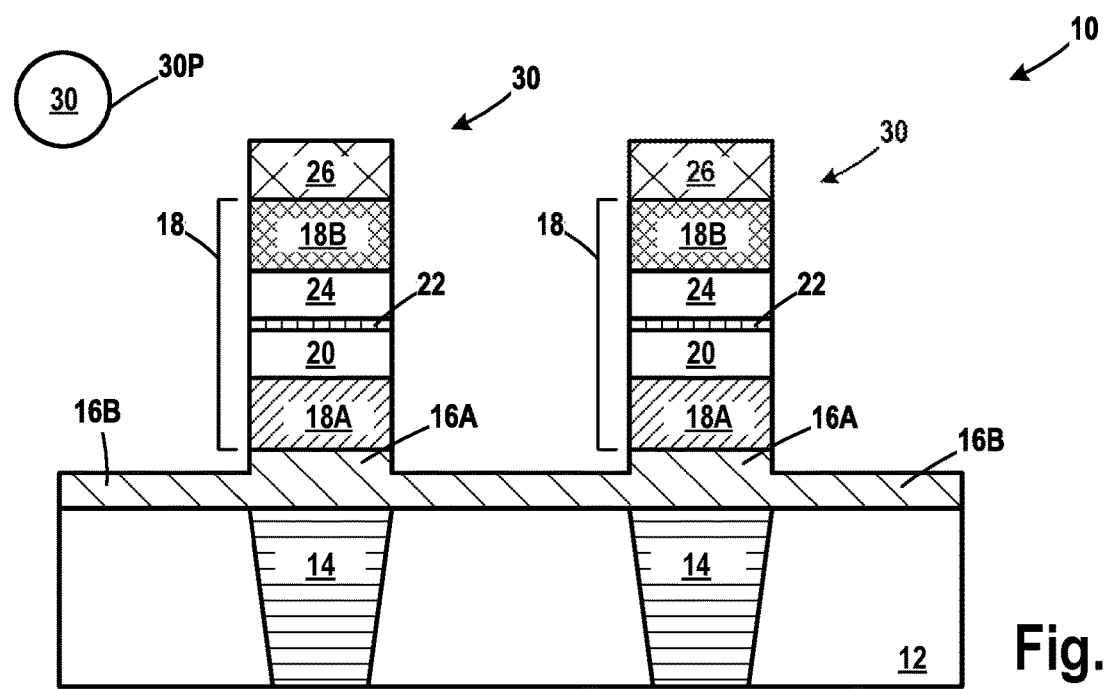

FIG. 4 depicts the product 10 after one or more etching processes, e.g., anisotropic etching processes, were performed through the patterned etch mask 28 to etch exposed portions of the layers 26, 18B, 24, 22, 20, 18A and 16 so as to result in the formation of a plurality of MRAM cells 30. In the illustrative example depicted herein, the etching process is stopped within the layer of bottom electrode material 16. As a result, a first portion 16A of the layer of bottom electrode material 16 functions as the bottom electrode for each of the memory cells, while the remaining portions 16B of the layer of bottom electrode material 16 functions as a conductive word line. Of course, other process flows and configurations are possible. For example, the layer of bottom electrode material 16 may be completely etched throughout its entire vertical thickness, i.e., such that the layer of insulating material 12 is exposed, in which case the bottom electrode for the memory cell 30 would be a discrete element. The patterned etch mask 28 was removed after the completion of the etching processes. The MRAM cells 30 may have a variety of different configurations or shapes when viewed from above. In the examples depicted herein, the MRAM cells 30 will be patterned so as to have a substantially circular configuration when viewed from above, as indicated in the upper left portion of FIG. 4. In the depicted example, the MRAM cells 30 have an outer perimeter 30P.

Figure 5:
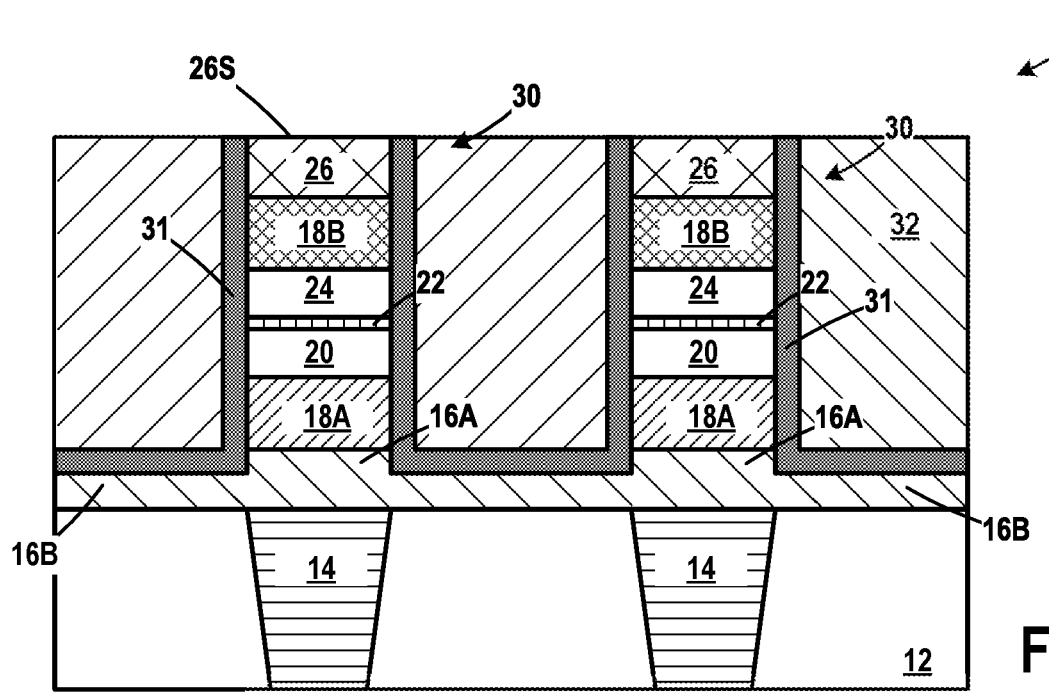

FIG. 5 depicts the IC product 10 after several process operations were performed. First, a conformal deposition process was performed to form a conformal encapsulation layer 31 across the product 10. The conformal encapsulation layer 31 may be of any desired thickness and it may be comprised of any of a variety of different materials, e.g., SiN, SiC, SiCN, SiOCN, $Al_2O_3$, $HfO_x$, etc. As initially formed, the conformal encapsulation layer 31 covers the upper surface 26S of the top electrode 26 of each of the memory cells 30. Thereafter, a representative layer of insulating material 32 was formed above the conformal encapsulation layer 31. The layer of insulating material 32 is intended to be representative in nature as it may in fact comprise multiple layers of material, e.g., insulating materials and etch stop layers. The layer of insulating material 32 may be of any desired thickness and it may be comprised of any of a variety of different materials, e.g., $SiO_2$, a low-k material, etc. Next, a CMP process was performed to remove the portions of the conformal encapsulation layer 31 positioned above the upper surface 26S of the top electrode 26 of the memory cells 30.

Figure 6:
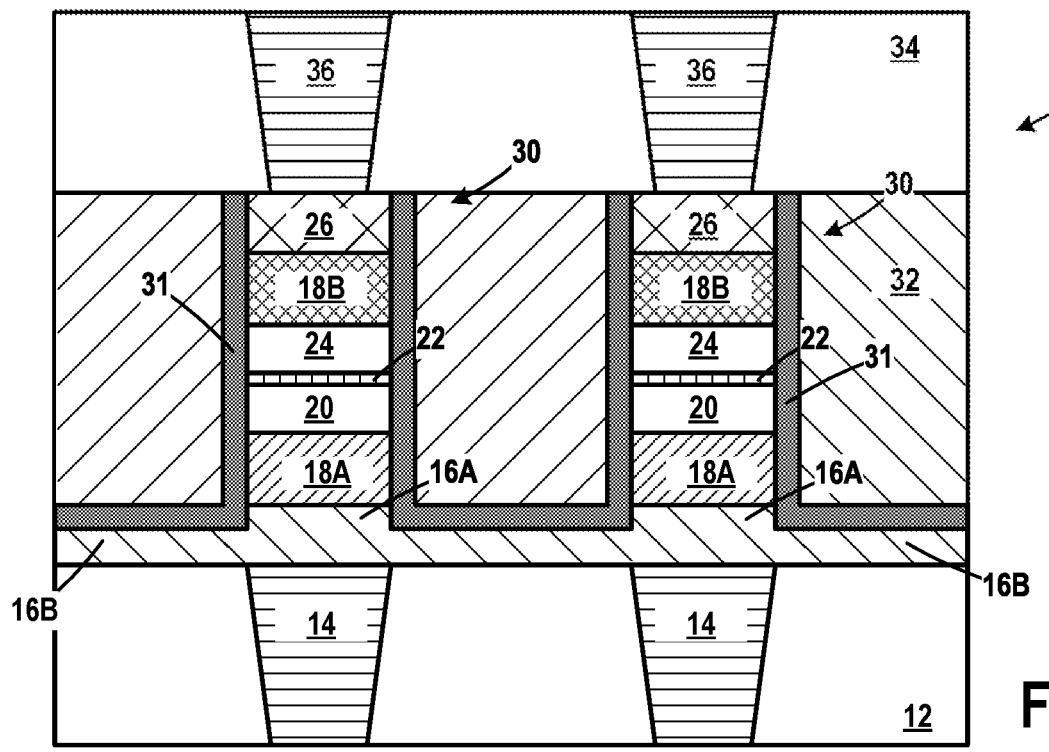

FIG. 6 depicts the product 10 after several process operations were performed. First, a layer of insulating material 34 (e.g., silicon dioxide, a low-k material (k value less than 3.3)) was formed above the memory cells 30. Next, illustrative separate conductive contact structures 36 (e.g., conductive vias) were formed in the layer of insulating material 34 so as to conductively contact the top electrode 26 of each of the memory cells 30. The conductive contact structures 36 may be comprised of any conductive material, they may be of any desired configuration, and they may be manufactured using any of a variety of different known manufacturing techniques (e.g., single or dual damascene). As part of these process operations, contact openings would be formed in the layer of insulating material 34 above the top electrodes 26. If the portion of the conformal encapsulation layer 31 positioned above the upper surface 26S of the top electrodes 26 had not been previously removed, as described above with respect to FIG. 5, the conformal encapsulation layer 31 positioned above the upper surface 26S of the top electrodes 26 could be removed at this point in the process flow as well.

Figure 7:
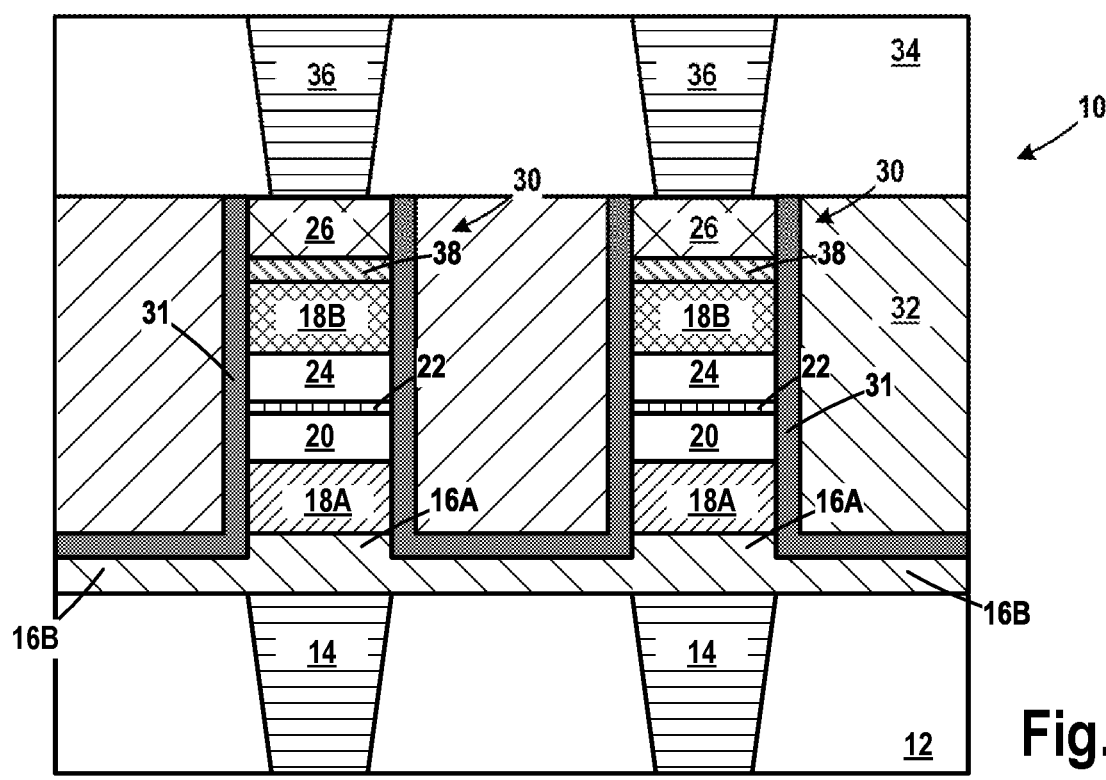

FIG. 7 depicts an alternative embodiment of an illustrative memory cell 30 disclosed herein. In this embodiment, the memory cell 30 comprises an optional layer of insulating material 38 positioned between the top electrode 26 and the free ferromagnetic material layer 18B. The layer of insulating material 38 may be comprised of a variety of different materials, e.g., MgO, and it may be formed to any desired thickness, e.g., 0.5-1.5 nm. In one illustrative process flow, the layer of insulating material 38 may be formed above the free ferromagnetic material layer 18B at the point of processing shown in FIG. 2. Thereafter, the layer of insulating material 38 may be patterned along with the other layers of material for the memory cell 30. If present, the layer of insulating material 38 may increase the PMA (perpendicular magnetic anisotropy) of the memory cell 30.

As will be appreciated by those skilled in the art after a complete reading of the present application, the novel MRAM cells 30 disclosed herein provide significant benefits relative to prior art MRAM cells. Typically, for prior art MRAM cells formed using PVD processes, where the MTJ structure comprises an uninterrupted continuous layer of MgO positioned between the free ferromagnetic layer and the pinned ferromagnetic layer, the best TMR values achieved for less than 10Ω-μm$^2$ RA product are typically less than about 200%. Such relatively low TMR values reduce the sense margin of the prior art MRAM cell, thereby limiting the ability to incorporate such prior art MRAM cells in a high-density memory array in an IC product.

In contrast, due to the incorporation of the novel IFI structure 19 in the novel memory cell 30 disclosed herein, the TMR values and the sense margin for the novel memory cell 30 disclosed herein may be greater than that of a typical prior art MRAM cell formed using PVD processes. For example, the novel memory cell 30 disclosed herein may have a theoretical TMR value of about 1574% as compared to a theoretical TMR value of about 1200% for a typical MRAM cell that comprises a continuous insulation layer, e.g., MgO (with no ferromagnetic material positioned within the continuous layer of MgO). However, for a real-world MRAM cell 30 disclosed herein that is made using PVD processes, the TMR value falls within the range of about 230-250%. This represents an improvement of the TMR value of the novel memory cell 30 of about approximately 31% relative to a prior art MRAM cell (made using PVD processes) with a continuous insulation layer, e.g., MgO (with no ferromagnetic material positioned within the continuous layer of MgO).

A very important aspect of the novel memory cell 30 disclosed herein is positioning of the ultrathin ferromagnetic material layer 22 between the bottom insulation layer 20 and the top insulation layer 24. If the ferromagnetic material layer 22 is made too thick, e.g., if it is made to a thickness greater than about 12 angstroms, then the ferromagnetic material layer 22 will essentially function as another free ferromagnetic material layer and the overall functionality of such an MRAM cell would be problematic and difficult to read any stored value on such an MRAM cell (with a thick ferromagnetic material layer).

However, by incorporation of the ultrathin ferromagnetic material layer 22 into the novel IFI structure 19 disclosed herein, the TMR value and sensing margin for the novel memory cell 30 are improved relative to a typical prior art MRAM cell. This occurs because the ultrathin ferromagnetic material layer 22 only makes the "spin filtering" aspect of the novel memory cell 30 more efficient and it does not actively participate in the STT switching mechanism of the novel memory cell 30 due to the lack of magnetic moment and interfacial anisotropy. In one illustrative example, the ultrathin ferromagnetic material layer 22 may be formed by performing various CVD processes. In such an illustrative example, the expected amorphous nature of the ultrathin ferromagnetic material layer 22 due to the PVD process ensures that there is a weak coupling within the ultrathin ferromagnetic material layer 22 and along the vertical (+z) direction. Thus, the ultra-thin ferromagnetic layer 22 does not act as pseudo-free layer and does not interfere with the STT switching process. Of course, as will be appreciated by those skilled in the art after a complete reading of the present application, the inventions disclosed herein are not limited to situations where the ferromagnetic material layer 22 is amorphous in nature. More specifically, the inventions disclosed herein may be employed in situations where the ferromagnetic material layer 22 has a substantially crystalline structure.

As a result, the ultrathin ferromagnetic material layer 22 exhibits substantially non-magnetic behavior toward the STT switching mechanism. However, as will be appreciated by those skilled in the art after a complete reading of the present application, in the design of the novel memory cell 30 disclosed herein, it should be ensured that there is no dipolar coupling between the pinned ferromagnetic material layer 18A and the free ferromagnetic material layer 18B. Additionally, the technology reflected in the novel memory cell 30 disclosed herein may be transferred over a wide range of MTJ recopies and RA products.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is there-fore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A memory cell, comprising:
   a bottom electrode;
   a top electrode positioned above the bottom electrode; and
   a first MTJ (Magnetic Tunnel Junction) element positioned above a first portion of the bottom electrode and below the top electrode, wherein the first MTJ element includes:
   a bottom insulation layer positioned above the first portion of the bottom electrode;
   a top insulation layer positioned above the first portion of the bottom electrode; and
   a first ferromagnetic material layer positioned between the bottom insulation layer and the top insulation layer;
   a second ferromagnetic material layer positioned between the first portion of the bottom electrode and the bottom insulation layer; and
   a third ferromagnetic material layer positioned between the top electrode and the top insulation layer, wherein the third ferromagnetic material layer is a free ferromagnetic material layer; and
   a second MTJ element adjacent the first MTJ element and above a second portion of the bottom electrode, wherein the bottom electrode extends continuously beneath the first and second memory cells such that the first and second MTJ elements share the bottom electrode.

2. The memory cell of claim 1, wherein the memory cell is an MRAM (magnetic random access memory) device.

3. The memory cell of claim 1, wherein the second ferromagnetic material layer is a pinned ferromagnetic material.

4. The memory cell of claim 1, wherein the first ferromagnetic material layer is positioned on and in physical contact with an upper surface of the bottom insulation layer and wherein the top insulation layer is positioned on and in physical contact with an upper surface of the first ferromagnetic material layer.

5. The memory cell of claim 1, wherein the first ferromagnetic material layer has a thickness of at most 12 angstroms.

6. The memory cell of claim 1, wherein the top insulation layer and the bottom insulation layer have a same vertical thickness.

7. The memory cell of claim 1, wherein the top insulation layer and the bottom insulation layer includes one of MgO, $Al_2O_3$, $TiO_x$, AlTiO, MgZnO, ZnO or $Ga_2O_3$, the first ferromagnetic material layer includes one of Fe, Co, FeB, Co/Pt, a Co/Ni multi-layer, or a CoFeB alloy, the second ferromagnetic material layer includes one of Fe, Co, FeB, Co/Pt, a Co/Ni multi-layer, or a CoFeB alloy and the third ferromagnetic material layer includes one of Fe, Co, FeB, Co/Pt, a Co/Ni multi-layer, or a CoFeB alloy.

8. The memory cell of claim 1, wherein the first ferromagnetic material layer has a first vertical thickness, the second ferromagnetic material layer has a second vertical thickness and the third ferromagnetic material layer has a third vertical thickness, wherein the first vertical thickness is less than each of the second vertical thickness and the third vertical thickness.

9. The memory cell of claim 8, wherein the second vertical thickness and the third vertical thickness are substantially equal.

10. The memory cell of claim 1, further comprising:
a layer of insulating material positioned between the third ferromagnetic material layer and the top electrode; and
a conductive structure positioned on and in contact with an upper surface of the top electrode.

11. The memory cell of claim 1, wherein the bottom insulation layer includes an oxide material and the top insulation layer includes an oxide material.

12. A memory cell, comprising:
a bottom electrode;
a top electrode positioned above the bottom electrode;
a first MTJ (Magnetic Tunnel Junction) element positioned above a first portion of the bottom electrode and below the top electrode, wherein the MTJ element includes:
a bottom oxide layer positioned above the first portion of the bottom electrode;
a top oxide layer positioned above the first portion of the bottom electrode; and
a first ferromagnetic material layer positioned between the bottom oxide layer and the top oxide layer;
a second ferromagnetic material layer vertically between the first portion of the bottom electrode and the bottom oxide layer, wherein the second ferromagnetic material layer includes a lower surface in contact with the top surface of the first portion of the bottom electrode; and
a third ferromagnetic material layer positioned between the top electrode and the top oxide layer, wherein the third ferromagnetic material layer is a free ferromagnetic material layer; and
a second MTJ element adjacent the first MTJ element and above a second portion of the bottom electrode, wherein the bottom electrode extends continuously beneath the first and second memory cells such that the first and second MTJ elements share the bottom electrode.

13. The memory cell of claim 12, wherein the second ferromagnetic material layer is a pinned ferromagnetic material.

14. The memory cell of claim 12, wherein a bottom surface of the first ferromagnetic material layer is positioned on and in physical contact with an upper surface of the bottom oxide layer, wherein a bottom surface of the top oxide layer is positioned on and in physical contact with an upper surface of the first ferromagnetic material layer, wherein a bottom surface of the second ferromagnetic material layer is positioned on and in physical contact with an upper surface of the bottom electrode, wherein a bottom surface of the bottom oxide layer is positioned on and in physical contact with an upper surface of the second ferromagnetic material layer, wherein a bottom surface of the third ferromagnetic material layer is positioned above an upper surface of the top oxide layer and wherein a bottom surface of the top electrode is positioned above an upper surface of the third ferromagnetic material layer.

15. The memory cell of claim 12, wherein the top oxide layer and the bottom oxide layer have a same vertical thickness and wherein the first ferromagnetic material layer has a thickness of at most 12 angstroms.

16. The memory cell of claim 15, wherein the first ferromagnetic material layer has a first vertical thickness, the second ferromagnetic material layer has a second vertical thickness and the third ferromagnetic material layer has a third vertical thickness, wherein the first vertical thickness is less than each of the second vertical thickness and the third vertical thickness and wherein the second vertical thickness and the third vertical thickness are substantially equal.

17. A memory cell, comprising:
a bottom electrode;
a top electrode positioned above the bottom electrode;
a first MTJ (Magnetic Tunnel Junction) element positioned above a first portion of the bottom electrode, wherein the MTJ element includes:
a bottom magnesium oxide layer positioned above the first portion of the bottom electrode;
a top magnesium oxide layer positioned above the first portion of the bottom electrode;
a first ferromagnetic material layer positioned between the bottom magnesium oxide layer and the top magnesium oxide layer, wherein a bottom surface of the first ferromagnetic material layer is positioned on and in physical contact with an upper surface of the bottom magnesium oxide layer and wherein a bottom surface of the top magnesium oxide layer is positioned on and in physical contact with an upper surface of the first ferromagnetic material layer;
a second ferromagnetic material layer positioned between the first portion of the bottom electrode and the bottom magnesium oxide layer, wherein a bottom surface of the second ferromagnetic material layer is positioned on and in physical contact with an upper surface of the first portion of the bottom electrode and wherein a bottom surface of the bottom magnesium oxide layer is positioned on and in physical contact with an upper surface of the second ferromagnetic material layer;
a third ferromagnetic material layer positioned between the top electrode and the top magnesium oxide layer, wherein a bottom surface of the third ferromagnetic material layer is positioned on and in physical contact with an upper surface of the top oxide layer and wherein a bottom surface of the top electrode is positioned on and in physical contact with an upper surface of the third ferromagnetic material layer, and wherein the first ferromagnetic material layer has a thickness of at most 12 angstroms; and
a second MTJ element adjacent the first MTJ element and above a second portion of the bottom electrode, wherein the bottom electrode extends continuously beneath the first and second memory cells such that the first and second MTJ elements share the bottom electrode.

18. The memory cell of claim 17, wherein the top magnesium oxide layer and the bottom magnesium oxide layer have a same vertical thickness.

* * * * *